United States Patent
Dougherty et al.

(10) Patent No.: US 6,203,869 B1
(45) Date of Patent: *Mar. 20, 2001

(54) HYDROGEN GETTERS AND METHODS FOR FABRICATING SEALED MICROELECTRONIC PACKAGES EMPLOYING SAME

(76) Inventors: Thomas K. Dougherty, 8515 Falmouth Ave. #421, Playa Del Rey, CA (US) 90293; O. Glenn Ramer, 317 S. Rockingham, Los Angeles, CA (US) 90049; Venita L. Dyer, 5350 Sepulveda #14, Sherman Oaks, CA (US) 91411

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/747,709

(22) Filed: Nov. 12, 1996

(51) Int. Cl.⁷ .............................. B32B 1/04; B32B 15/08; B32B 27/38
(52) U.S. Cl. ...................... 428/35.7; 428/69; 428/413; 428/414; 428/416; 428/418; 53/79
(58) Field of Search .................... 428/34.1, 606, 428/607, 35.7, 36.9, 36.92, 413, 414, 416, 418, 69; 206/524.8; 53/79, 427; 156/245, 285, 286

(56) References Cited

U.S. PATENT DOCUMENTS

| | | | |
|---|---|---|---|
| 3,963,826 | * 6/1976 | Anderson et al. | 423/248 |
| 4,405,487 | * 9/1983 | Harrah et al. | 252/194 |
| 4,468,235 | * 8/1984 | Hill | 55/16 |
| 4,886,048 | * 12/1989 | Labaton et al. | 165/104.27 |
| 5,149,420 | * 9/1992 | Buxbaum et al. | 205/219 |
| 5,518,138 | * 5/1996 | Boffito et al. | 220/422 |
| 5,543,364 | * 8/1996 | Stupian et al. | 437/210 |
| 5,591,379 | * 1/1997 | Shores | 252/194 |
| 5,703,378 | * 12/1997 | Shepodd et al. | 252/182.12 |
| 5,760,433 | * 6/1998 | Ramer et al. | 257/295 |
| 5,861,665 | 1/1999 | Gustav et al. | |

* cited by examiner

Primary Examiner—Ellis Robinson
Assistant Examiner—John J. Figueroa
(74) Attorney, Agent, or Firm—Leonard A. Alkov; Colin M. Raufer; Glenn H. Lenzen, Jr.

(57) ABSTRACT

A hydrogen getter comprising a thin film having a layer of inert material, and a hydrogen reactive material disposed in or attached to the layer of inert material. The hydrogen reactive material may comprise palladium oxide powder, and the layer of inert material may comprise an epoxy resin. Various forms of the hydrogen reactive material may be used including porous composite, or a solid composite comprising a powder coated organic thin film, for example. An alternative gettering system that is operative in an oxygen environment uses a thin film of hydrogen reactive material that catalyzes the reaction of hydrogen and oxygen to form water. Improved sealed microelectronic packages are also disclosed along with methods of fabricating same.

1 Claim, 1 Drawing Sheet

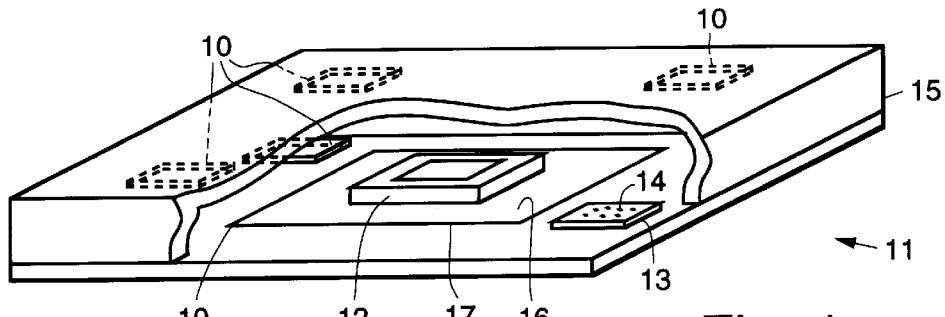
Fig. 1
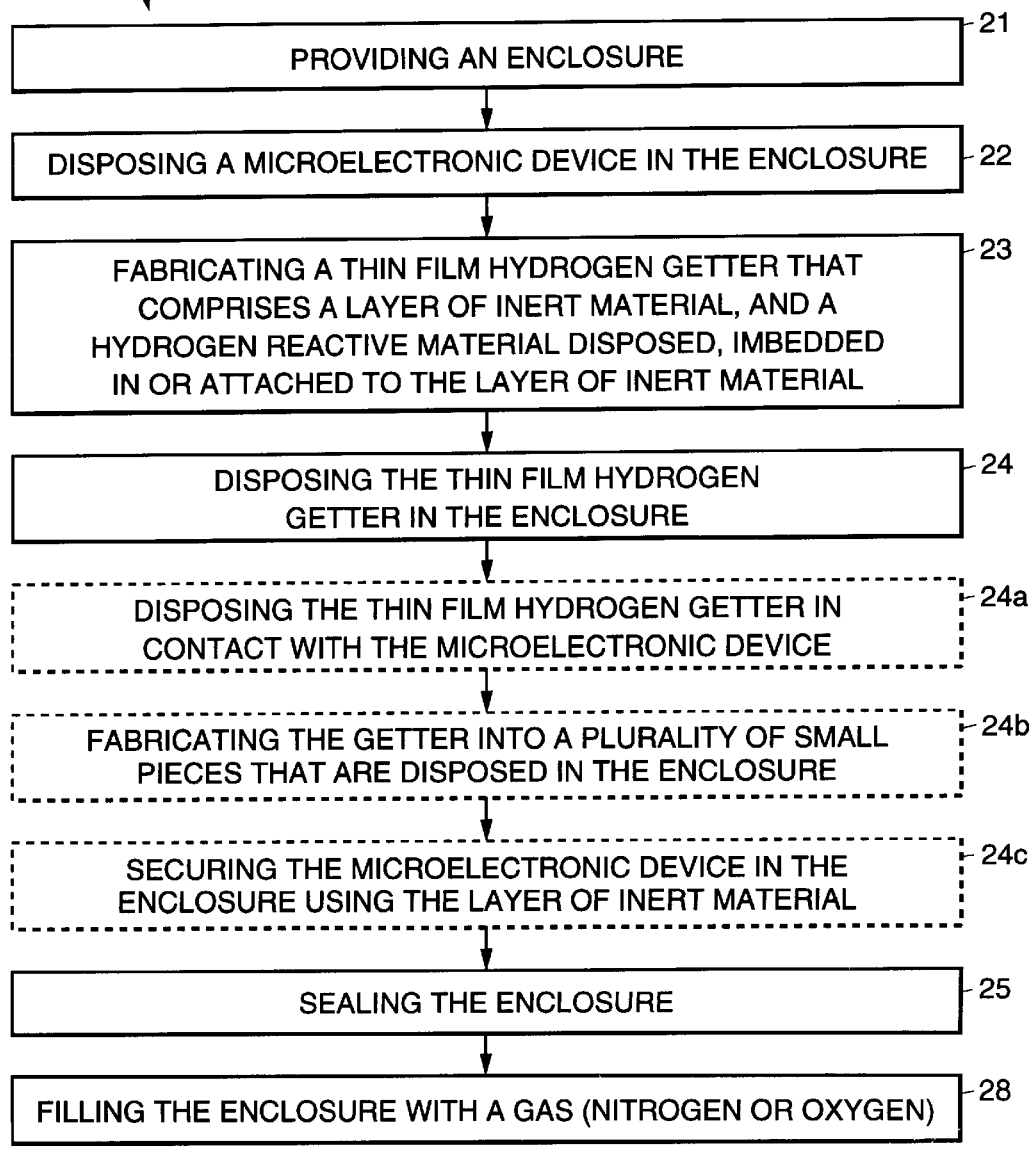

HYDROGEN GETTERS AND METHODS FOR FABRICATING SEALED MICROELECTRONIC PACKAGES EMPLOYING SAME

BACKGROUND

The present invention relates generally to getters for removing hydrogen from sealed microelectronic packages, and the like, and more particularly, to a composite film hydrogen getter for removing hydrogen from sealed microelectronic packages backfilled with an inert gas, and to a metal foil or thin metal film hydrogen getter that catalyzes the reaction of hydrogen with backfilled air or oxygen.

The deleterious effects of hydrogen on the performance of various types of electronic devices, such as gallium arsenide (GaAs) and related compound semiconductor devices, is well known. Hydrogen is capable of entering the crystal structure of these materials and wherein band-gap trap states are formed that limit the carrier lifetime of the devices. Thus, compound semiconductor devices suffer degraded electrical performance when operated at normal operating temperatures in an atmosphere that includes hydrogen. Therefore, reliable operation of such devices requires the removal or exclusion of hydrogen from the surrounding atmosphere. In addition, ferroelectric materials such as strontium bismuth tantalate or strontium bismuth tantalate niobate, for example, are sensitive to and degrade in the presence of small amounts of hydrogen.

Strontium bismuth tantalate (SBT), bismuth strontium tantalate niobate (SBTN), lead zirconate titanate (PZT) and many high temperature superconductors containing bismuth are all sensitive to small amounts of hydrogen at elevated temperatures. Ferroelectric memory devices containing these materials have failed at temperatures of 125° C. with less than 100 PPM hydrogen. The same parts are stable for extended periods at 125° C. when exposed to air (0.5 PPM hydrogen). For military and for an increasing segment of the commercial market survivability at 125° C. is mandatory.

The accumulation of hydrogen gas is particularly problematic in hermetically-sealed device packages. While hermetically-sealed packaging offers its contents protection against oxygen, water vapor, and other harmful contaminants present in the atmosphere, it also serves to retain and accumulate internally generated contaminants. Hydrogen outgasses from such devices and is accumulated within the hermetic packaging and invades semiconductor lattices of the device. Once in place, the hydrogen acts as a dopant that alters the response characteristics of the device in erratic ways. Hydrogen concentrations of 0.1% by volume (1000 PPM) dramatically alter the response characteristics of semiconductor devices, and hydrogen concentrations on the order of 0.5% by volume (5000 PPM) have been observed in hermetic packages after extended periods.

The present invention was developed specifically as a hydrogen gettering material for sealed microelectronic packages containing ferroelectric memory devices containing SBT and SBTN. While many vacuum gettering materials are commercially available and were evaluated for use, none were found to getter hydrogen sufficiently to protect the ferroelectric material. Conventional gettering materials do not work with sealed microelectronic packages primarily because they do not specifically getter hydrogen, but also getter other gases as well.

U.S. patent application Ser. No. 08/629,286, filed Apr. 8, 1996, entitled "Thin Film-Coated Foil Getters for Hydrogen in Electronic Device Packages" assigned to the assignee of the present invention provides for the use of a palladium (Pd) coated gettering metal, such as zirconium (Zr), titanium (Ti) for example, as a hydrogen getter. The gettering material disclosed in this patent application relies on the specificity of the clad (coated) material to diffuse hydrogen while not diffusing nitrogen or other elements, which permits the gettering metal to getter only hydrogen. These coated gettering metals were placed in sealed microelectronic packages backfilled with nitrogen and were tested, but they did not work sufficiently well to remove all the hydrogen from the sealed package in the presence of the nitrogen. Consequently, the electronic circuit in the microelectronic package degraded over time.

Powdered palladium oxide (PdO) has been used as a hydrogen getter material in dewars, for example. The difficulty with powdered palladium oxide gettering material is that the powder is loose in the package (i.e., not attached to the package). One embodiment of the present invention solves this problem. Another embodiment of the present invention capitalizes on the ability of certain metals to catalyze the reaction of hydrogen and oxygen to form water. Specifically this invention provides a palladium film in an oxygen containing package to getter the hydrogen by producing water.

Accordingly, it is an objective of the present invention to provide for a composite film hydrogen getter for removing hydrogen from sealed microelectronic packages backfilled with an inert gas. It is another objective of the present invention to provide for a metal foil or thin metal film hydrogen getter that catalyzes the reaction of hydrogen with backfilled air or oxygen.

SUMMARY OF THE INVENTION

To meet the above and other objectives, the present invention provides for a thin film hydrogen getter comprising a reactive composite film made of a hydrogen reactive material, such as palladium oxide powder, for example, that is deposited or otherwise disposed in an inert material or matrix, such as an epoxy resin, for example. The composite thin film hydrogen getter thus formed may be cut into or fabricated as small pieces that may be placed in a sealed microelectronic package or other sealed container, that houses an integrated circuit, and that may optionally be backfilled with an inert gas such as nitrogen. The hydrogen reactive material, or active ingredient, reacts with hydrogen within the sealed package, which typically outgasses from the package. The getter keeps hydrogen in the sealed package from reacting with the hydrogen sensitive materials in the integrated circuit, even in the absence of oxygen.

The present thin film getter thus provides a means for removing hydrogen from a sealed container, and specifically one that has been backfilled with an inert gas, and has been shown to work well with nitrogen. While powdered palladium oxide has been used to getter hydrogen in dewars, the present invention uses palladium oxide in a form that is suitable for use in sealed microelectronic packages and other sealed containers.

Other embodiments of the present invention capitalize on the ability of certain metals to catalyze the reaction of hydrogen and oxygen to form water. Specifically this embodiment of the present invention provides a palladium film in an oxygen containing package to getter the hydrogen by producing water. Palladium and other metals catalyze to decompose diatomic hydrogen producing reactive monatomic hydrogen. The reactive hydrogen reacts quickly with oxygen to produce water.

Thus, the present invention provides for a gettering system for use in sealed microelectronic packages containing hydrogen sensitive materials such as SBTN, and the like. Use of the present invention allows active ferroelectric materials and integrated circuits to survive under sealed packaging conditions. The scope and utility of the present invention thus enhances commercially manufactured semiconductor and ferroelectric devices.

The present invention also provides for methods for fabricating a sealed package containing the hydrogen getter. An enclosure is provided and a microelectronic device is disposed in the enclosure with the getter. The getter may comprise several different embodiments. The first embodiment comprises a layer of inert material and a hydrogen reactive material that is imbedded in or attached thereto. A second embodiment provides for hydrogen reactive material that is secured to a portion of the adhesive used to attach the microelectronic device to the enclosure, for example. A third embodiment attaches a metal foil to the enclosure using the same adhesive used to attach the microelectronic device to the enclosure. A fourth embodiment provides for the deposition of a thin metal film in an exposed region of the enclosure. The enclosure is then sealed in an appropriate atmosphere. In the first two embodiments, an inert gas may be disposed in the enclosure, and in the last two embodiments a partial pressure of oxygen is required.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 1 illustrates a thin film getter in accordance with the principles of the present invention for gettering hydrogen in sealed containers; and FIG. 2 is a flow chart illustrating methods of making a sealed package containing thin film hydrogen gettering systems of the present invention.

DETAILED DESCRIPTION

Referring to the drawing figures, FIG. 1 illustrates a thin film getter 10 for gettering hydrogen in sealed containers 11, such as sealed microelectronic packages 11 comprising a sealed enclosure 15 that contains a microelectronic device 12, for example. In a first embodiment, the thin film getters 10 comprises a host material 13 to which a hydrogen reactive material 14 has been added. In a second embodiment the hydrogen reactive material 16 is secured to a portion of adhesive 17 used to attach the microelectronic device 12 to the enclosure. A third embodiment allows for the attachment of a thin film getter 10 comprising a metal foil 10 to the enclosure using an adhesive 17. A fourth embodiment provides for the deposition of a thin film getter 10 comprising a thin metal film 10 in an exposed region of the enclosure.

The host material 13 comprises an inert material 13 or matrix 13, such as an epoxy resin, for example. The hydrogen reactive material 14 may comprise palladium oxide powder, for example. The thickness of the composite thin film 10 is typically on the order of 10–20 mils, for example, although other thicknesses may readily be formed. The size of the composite thin film getter 10 is typically on the order of 0.1 inches by 0.3 inches, for example, but it may be fabricated in any desired size.

In order for the hydrogen reactive material 14 (palladium oxide) to react to hydrogen in the sealed container 11, the composite thin film getter 10 either has porosity, or the hydrogen gettering material 14 is exposed on the surface of the host material 13. For example, the composite thin film getter 10 may be a porous composite, or a solid composite comprising a powder coated organic thin film. Thus, the getter 10 may be either a porous ceramic composite or an organic/inorganic solid composite comprising a powder containing or coated thin film, for example. The getter 10 thus may be a powder coated/containing mixture of active gettering material, such as palladium oxide, and a thermoset plastic, such as epoxy resin.

The composite thin film getter 10 may be cut into or fabricated in small pieces that may be placed in the sealed container 11, such as one that contains a microelectronic device 12. In the first embodiment, the sealed container 11 may also be backfilled with an inert gas. The hydrogen reactive material 14, or active ingredient, reacts with hydrogen within the sealed container 11, which typically outgasses therefrom. The hydrogen in the sealed container 11 is kept from reacting with hydrogen sensitive materials in the microelectronic device 12 by means of the hydrogen reactive material 14, or hydrogen gettering material 14.

The ceramic composite may be made by pressing and then sintering powdered palladium oxide into a disc or other shape. To make the porous ceramic composite, the palladium oxide may be mixed with a fugitive phase, such as carbon, for example, and optionally another ceramic or glass, such as a low melting borosilicate glass, for example, and the powders mixed and pressed, the fugitive phase removed by burnout, whereafter the part is sintered to yield a porous ceramic composite containing palladium oxide as the active hydrogen gettering material.

The first embodiment of the composite thin film getter 10 was reduced to practice and tested. In the test of the first embodiment described below, an organic/inorganic composite was constructed with hydrogen reactive material 14 contained in both the organic matrix (the host material 13) and attached to one surface thereof, and exposed to ambient atmosphere.

A 15 mil film of a uncured liquid high temperature epoxy resin comprising the host material 13, was laid down on a flat Teflon sheet which was used as a doctor blade. The uncured liquid high temperature epoxy resin may be A-1177-B1 and B2 epoxy resin available from B. F. Goodrich, for example. Palladium oxide in solid powder form was used as the hydrogen gettering material 14, and was placed on the film of epoxy resin. The solid powder palladium oxide may be gently sprinkled onto the epoxy resin, or a silk screen type technique may be used to produce a more consistent coating.

Another Teflon sheet was used to press down on the powder/epoxy composite that was formed. Palladium oxide powder not adhering to the epoxy resin was removed by vigorous tapping and/or shaking. The composite was then cured and solidified overnight at room temperature, and then baked out at 125 degrees Celsius under vacuum for 4 hours. This produced a sheet of composite thin film hydrogen getter 10.

The sheet of composite getter 10 may be cut into suitably sized pieces either mechanically or more preferably with a laser scribe to produce solid pieces of composite getter 10. The pieces of composite getter 10 were placed in and attached to a container 11 or package 11 containing a hydrogen sensitive electronic circuit 12 (a memory device) and sealed in a conventional manner.

The sealed container 11 or package 11 was then tested and was found to function for an extended period of time compared to a similar device that did not function after 36 hours at 125° C. The ferroelectric memory device was found to work properly after more than 1000 hours at 125 degrees Celsius.

The second embodiment of the present invention uses an adhesive 17 to attach a microelectronic circuit 12 within the sealed container 11 and the adhesive 17, that may contain an inert adhesion promoting material such as titanium, tantalum, or zirconium, for example, is also used as a medium to hold the hydrogen reactive material. In a reduced to practice second embodiment using the present invention, the entire die attach surface within a microelectronic package 11 was coated with a thin layer of liquid epoxy resin. A microelectronic device 12 was placed on the die attach surface in a desired position. Thus, the layer of liquid epoxy resin secures the microelectronic device 12 in the package 11. A predetermined amount of palladium oxide powder was distributed on the coated area surrounding the microelectronic device 12. The coated epoxy resin was then cured. After the epoxy was cured excess palladium oxide powder was removed by gently tapping and/or shaking. The microelectronic package 11 was then sealed and tested. Initial tests of the sealed microelectronic device 12 fabricated using this assembly method were successful. A 1000 hour test has shown that the packaged microelectronic device 12 was stable.

In a third embodiment of the present invention, a metal foil or thin metal film fabricated as small pieces may be placed in the sealed container 11, such as one that contains a microelectronic device 12, for example. The sealed container 11 is backfilled with a partial pressure of oxygen. The hydrogen reacts with the metal and backfilled oxygen within the sealed container to form water. The hydrogen in the sealed container 11 is kept from reacting with hydrogen sensitive materials in the microelectronic device 12.

The third embodiment was reduced to practice and is described below. In the embodiment described below a palladium foil 10 was attached to the enclosure 11 by an adhesive 17. The enclosure 11 was sealed with dry air. The sealed container 11 was then tested and was found to function for an extended period of time compared to a similar device that did not function after 36 hours at 125° C. The ferroelectric memory device was found to work properly after more than 2000 hours at 125 degrees Celsius.

Referring to FIG. 2, and for completeness, it is a flow chart illustrating several methods 20 of fabricating a sealed package 11 containing a thin film getter 10. Methods 20 of fabricating a sealed microelectronic package 11 having an improved getter 10 comprise the following steps. An enclosure 15 is provided 21. A microelectronic device 12 is disposed 22 in the enclosure 15. A thin film hydrogen getter 10 is fabricated 23 that comprises a layer of inert material 13, and a hydrogen reactive material 14 such as palladium oxide powder imbedded in or attached to the layer of inert material 13. The thin film hydrogen getter 10 is disposed 24 in the enclosure 15. This may be achieved by disposing 24a the hydrogen getter 10 in contact with the microelectronic device 12. This may also be achieved by fabricating 24b the hydrogen getter 10 into a plurality of small pieces that are disposed within the enclosure 15. This may also be achieved by securing 24c the microelectronic device 12 in the enclosure 15 using the layer of inert material 13, wherein the hydrogen reactive material 14 may be distributed on a coated area of the layer of inert material 13 that surrounds the microelectronic device 12. Once the getter 10 is disposed in the enclosure 15, it is sealed 25. The hydrogen reactive material 14 getters hydrogen within the sealed enclosure 15. In some embodiments of the present invention, the enclosure 15 may be filled 28 with nitrogen after it is sealed 25. In other embodiments, the sealed container 11 is backfilled with a partial pressure of oxygen after the hydrogen getter 10 is disposed therein, and wherein the getter 10 catalyzes to decompose diatomic hydrogen to produce reactive monatomic hydrogen that reacts with oxygen to produce water.

Thus, composite film hydrogen getters for use in packaged microelectronic devices have been disclosed. It is to be understood that the described embodiments are merely illustrative of some of the many specific embodiments which represent applications of the principles of the present invention. Clearly, numerous and other arrangements can be readily devised by those skilled in the art without departing from the scope of the invention.

What is claimed is:

1. A sealed microelectronic package having a sealed enclosure and a hydrogen gettering system for removing hydrogen from sealed microelectronic packages backfilled with an inert gas, comprising:

a microelectronic package having a die attach surface;

a thin layer of liquid epoxy resin entirely covering the die attach surface;

a microelectronic device placed on the thin layer of liquid epoxy resin surface in a desired position;

a layer of inorganic solid powder palladium oxide material disposed on the thin layer of liquid epoxy resin surrounding the microelectronic device to form a hydrogen reactive organic/inorganic composite film upon curing;

wherein the thin layer of liquid epoxy resin serves the dual function of securing the microelectronic device in the microelectronic package and also reacting with the solid powder palladium oxide material to form a hydrogen reactive organic/inorganic composite thin film.

* * * * *